(12) United States Patent
Omi

(10) Patent No.: US 6,759,700 B2
(45) Date of Patent: Jul. 6, 2004

(54) OPTICAL SENSOR AND MANUFACTURING METHOD OF THE SAME

(75) Inventor: Toshihiko Omi, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 10/005,036

(22) Filed: Dec. 4, 2001

(65) Prior Publication Data

US 2002/0074483 A1 Jun. 20, 2002

(30) Foreign Application Priority Data

Dec. 5, 2000 (JP) ........................................ 2000-370184

(51) Int. Cl.[7] ..................... H01L 31/062; H01L 31/119; H01L 31/113; H01L 31/0232; H01L 31/06; H01L 27/148

(52) U.S. Cl. ......................................... 257/292; 438/48

(58) Field of Search ................................. 257/292, 436, 257/462, 232; 438/48

(56) References Cited

U.S. PATENT DOCUMENTS

| 6,090,639 | A | * | 7/2000 | Pan ............................... 438/59 |
| 6,100,551 | A | * | 8/2000 | Lee et al. .................... 257/232 |
| 6,150,189 | A | * | 11/2000 | Pan ............................... 438/59 |

* cited by examiner

Primary Examiner—Samuel Gebremariam
(74) Attorney, Agent, or Firm—Adams & Wilks

(57) ABSTRACT

A high-sensitive optical sensor is provided. In the optical sensor in which MOS transistors and a semiconductor light-receiving element are integrated, the light-receiving element includes a PN junction, and charges generated by the irradiation with light are accumulated at the PN junction, the PN junction of the light-receiving element is isolated from well regions of the MOS transistors.

1 Claim, 7 Drawing Sheets

OPTICAL SENSOR AND MANUFACTURING METHOD OF THE SAME

BACKGROUND OF THE INVENTION

1. Field of the Invention

In optical sensors in which MOS transistors and a semiconductor light-receiving element are integrated it is easy to integrate the light-receiving element in a one-dimensional or two-dimensional array manner. Such devices are applied in various applications, such as the pickup light-receiving element of an optical disc apparatus, the autofocus light-receiving element of a camera, a facsimile apparatus, a document reading unit of an image scanner, a digital camera, and a video camera. The present invention relates to such an optical sensor that is widely used for consumer products and has a construction where MOS transistors and a semiconductor light-receiving element are integrated.

2. Description of the Related Art

Optical sensors constructed using semiconductor light-receiving elements are broadly divided into CCD-type optical sensors and CMOS-type optical sensors, based on the different methods according to which charges generated at light-receiving sections by the irradiation with light are transmitted to output amplifiers. In the case of the CCD-type optical sensors, the transmission loss of charges generated at the light-receiving sections is suppressed and there occurs less noise during transmission of the charges. Therefore, a high SN ratio is obtained and it is possible to realize high image quality. Consequently, the CCD-type optical sensors are used in various fields, the main one of which is the home video field. The CCD-type optical sensors, however, require a plurality of high voltage power supplies and therefore consume large amounts of electricity, in comparison with ICs and LSIs that are usually used. Also, the method of manufacturing the CCD-type optical sensors greatly differs from that of manufacturing CMOSs constituting integrated circuits such as ICs and LSIs, so that it is difficult to integrate additional functions such as an image processing function.

Recent advancements of portable devices create demands for ICs and LSIs that operate at low power supply voltages, consume less electricity, and have high performance. Similarly, there are created demands for optical sensors that operate at low voltages, consume less electricity, and have integrated additional functions. The CMOS-type optical sensors operate based on MOS transistors constituting ICs and LSIs, so that they can operate at low voltages and reduce power consumption, like ICs and LSIs. Also, the method of manufacturing the CMOS-type optical sensors is the same as that of manufacturing ICs and LSIs, so that it is easy to integrate a high-performance circuit that achieves processing functions. Consequently, the CMOS-type optical sensors receive attention as a technology taking the place of the CCD-type optical sensors.

The CMOS-type optical sensors, however, have a problem that there occurs large noise during the transmission of charges generated at light-receiving sections and therefore image quality is poor in comparison with the CCD-type optical sensors. If a circuit for amplifying and transmitting charges is provided in the vicinity of a light-receiving section in order to reduce such noise, this causes another problem that the area of the light-receiving section becomes relatively small in comparison with a CCD-type optical sensor and therefore the sensitivity of the light-receiving section is decreased.

Also, it is required to manufacture an optical sensor without changing the characteristics of MOS transistors constituting ICs and LSIs for the purpose of integrating an additional circuit. MOS transistors are formed in well regions and the well regions are usually formed using a self-aligned twin well method according to which impurities are implanted into the well regions of one of P-channel MOS transistors and N-channel MOS transistors, thick oxide films are formed through selective oxidation only in the regions in which the impurities have been implanted, and impurities are implanted into the well regions of others of the MOS transistors without using a mask. With the self-aligned twin well method, the well regions of the P-channel MOS transistors always contact the well regions of the N-channel MOS transistors, and the well regions of one of the P-channel MOS transistors and the N-channel MOS transistors formed by implanting impurities exist on a semiconductor substrate. FIG. 5 is a sectional view of the conventional optical sensor.

P-channel MOS transistors 10 and 50, N-channel MOS transistors 20 and 30, and a PN junction diode 1 that is a light-receiving element are formed on a P-type (100) silicon substrate 6. The P-channel MOS transistor 10 includes a gate 12 made of polysilicon and P+ regions 13 that are source and drain regions and are formed in an N-type well region 11. Similarly, the P-channel MOS transistor 50 includes a gate 52 made of polysilicon and P+ regions 53 that are source and drain regions and are formed in an N-type well region 51. Also, the N-channel MOS transistor 20 includes a gate 22 made of polysilicon and N+ regions 23 that are source and drain regions and are formed in a P-type well region 21. Similarly, the N-channel MOS transistor 30 includes a gate 32 made of polysilicon and N+ regions 33 that are source and drain regions and are formed in a P-type well region 31. In the N-type well regions 11 and 51 under the field oxide films 68, N+/− regions 14 and 54 whose impurity densities are higher than those in the well regions are formed. Also, in the P-type well regions 21 and 31 under the field oxide films, P+/− regions 24, 25, 34, and 35 whose impurity densities are higher than those in the well regions are formed.

The N-type well regions 11 and 51 have polarities which are different from the polarity of the silicon substrate, and contact the P-type well regions 21 and 31. The diode 1 that is a light-receiving element is constituted by an N-type region 2 and the P-type silicon substrate 6. An N+ region 3 is formed in the N-type region 2 for establishing contact. Field oxide films 8 are formed on the N-type region 2 and light to be received passes through the field oxide films 8 and reaches the diode 1. The N-type region 2 is contact with the P+/− region 25, the P-type well region 21, the P+/− region 35 and the P-type well region 31. Consequently, as shown in FIG. 5, even if a PN junction that will function as a light-receiving element is newly formed, the PN junction will contact the well regions of one of the P-channel MOS transistors and the N-channel MOS transistors.

In general, as MOS transistors become finer, there are increased the densities of impurities in the well regions of the MOS transistors. Meanwhile, the capacity of a PN junction is increased in accordance with the increase of the impurity density in & region forming the PN junction. Accordingly, as the packing densities of ICs and LSIs are increased and MOS transistors become finer to accelerate their operation speeds, the capacity of a PN junction serving as a light-receiving element tends to be increased.

Also, the area of a light-receiving element becomes small and the sensitivity thereof is decreased in accordance with the increase of the number of pixels of an optical sensor. Further, the sensitivity of a light-receiving element is proportional to Q/C determined by the amount Q of charges generated by photons reaching the light-receiving element and the capacity c of the PN junction portion of the light-receiving element including a diode. Consequently, the sensitivity of a light-receiving element is decreased in accordance with the increase of the capacity of a PN junction. As a result, if an optical sensor is manufactured according to a manufacturing process for MOS transistors of ICs and LSIs, the sensitivity of a light-receiving element tends to be further decreased as the MOS transistors become finer.

Also, if the impurity densities in the well regions of MOS transistors are changed or heat treatment conditions used, for instance, in an oxidization step during a process for forming the well regions of MOS transistors are changed in order to decrease the impurity density in a PN junction portion that will function as an optical sensor, there is a danger that the characteristics of the MOS transistors are changed. In this case, there is placed a significant burden on the design work of an electronic circuit constructed using MOS transistors.

The present invention has been made in the light of the problems described above and the object of the present invention is to provide an optical sensor that is manufactured without changing the characteristics of MOS transistors constituting ICs and LSIs and has a light-receiving element with a high sensitivity.

SUMMARY OF THE INVENTION

The present invention provides an optical sensor in which MOS transistors and a semiconductor light-receiving element are integrated, the light-receiving element includes a PN junction, and charges generated by the irradiation with light are accumulated at the PN junction, characterized in that the PN junction of the light-receiving element is isolated from well regions of the MOS transistors. The present invention also provides a manufacturing method of such an optical sensor. The PN junction of the light-receiving element does not contact with well region of MOS transistor and the impurity of the semiconductor substrate is lower than that of the impurity region or the light-receiving element and well region so that the capacity of the PN junction of the light-receiving element becomes small.

The MOS transistors are P-channel MOS transistors and N-channel MOS transistors, and the well regions of both of the P-channel MOS transistors and the N-channel MOS transistors are formed by implanting impurities into the semiconductor substrate. In the case where the well regions are formed using a self-aligned twin well method, there is obtained an optical sensor in which MOS transistors and a semiconductor light receiving element are integrated, the light-receiving element includes a PN junction, charges generated by the irradiation with light are accumulated at the PN junction, and the PN junction of the light-receiving element is separated from the well regions of the MOS transistors. In this case, the optical sensor is characterized in that well regions of both of P-channel MOS transistors and N-channel MOS transistors are formed by implanting impurities into a semiconductor substrate, and the well regions of the P-channel MOS transistors contact the well regions of the N-channel MOS transistors.

The stated optical sensor is obtained by implanting impurities to form the well regions of one of the P-channel MOS transistors and the N-channel MOS transistors; selectively oxidizing areas above the well regions of the MOS transistors into which the impurities have been implanted; masking an area in which the light-receiving element and a region around the light-receiving element are to be formed with a photoresist; and implanting impurities to form the well regions of the other MOS transistors, thereby forming the well regions of the P-channel MOS transistors and the N-channel MOS transistors. The optical sensor manufactured in this manner has a construction where the PN junction of the light-receiving element is isolated from well regions of the MOS transistors, well regions of both of the P-channel MOS transistors and the N-channel MOS transistors are formed by implanting impurities into a semiconductor substrate, and the well regions of the P-channel MOS transistors contact the well regions of the N-channel MOS transistors.

The stated optical sensor is also obtained by implanting impurities to form the well regions of one of the P-channel MOS transistors and the N-channel MOS transistors; selectively oxidizing areas above the well regions of the MOS transistors into which the impurities have been implanted and an area in which the light-receiving element and a region around the light-receiving element are to be formed; and implanting impurities to form the well regions of the other MOS transistors without using a mask, thereby forming the well regions of the P-channel MOS transistors and the N-channel MOS transistors. The well regions of the P-channel MOS transistors and the N-channel MOS transistors are formed in the manner described above. The optical sensor manufactured in this manner has a construction where the PN junction of the light-receiving element is isolated from well regions of the MOS transistors, well regions of both of the P-channel MOS transistors and the N-channel MOS transistors are formed by implanting impurities into a semiconductor substrate, and the well regions of the P-channel MOS transistors contact the well regions of the N-channel MOS transistors.

DETAILED DESCRIPTION OF THE PREFERRED EMBODIMENTS

Figure 1:
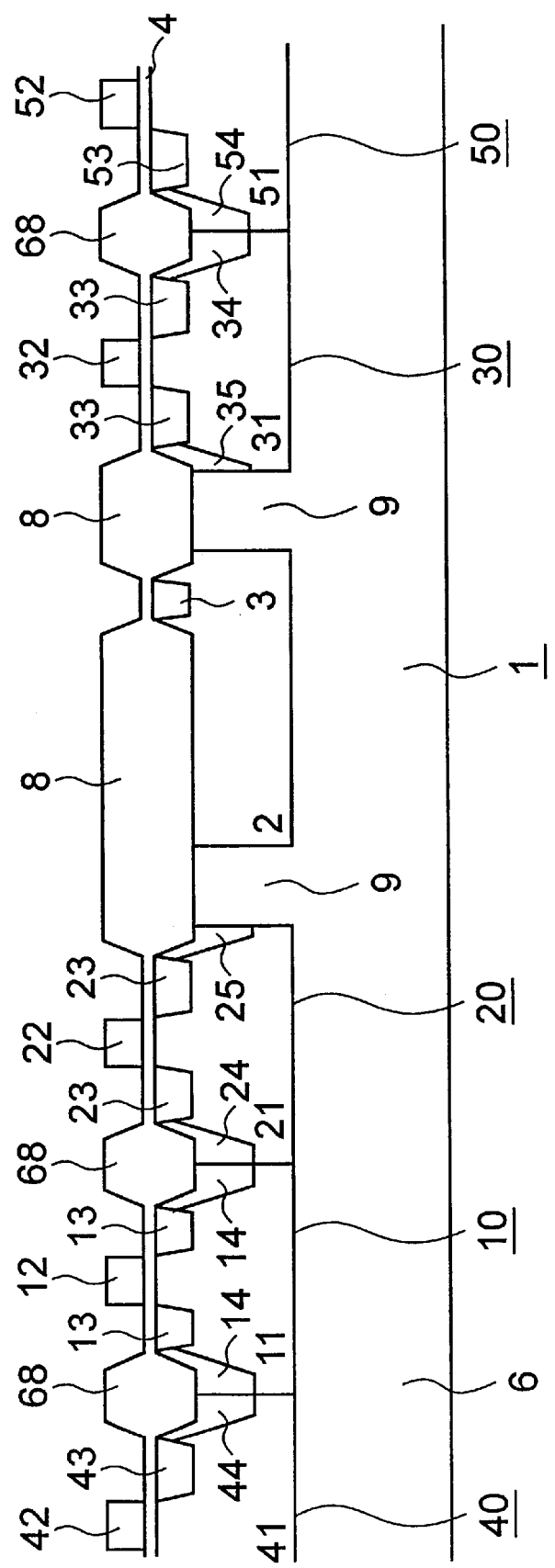
FIG. 1 is a cross sectional view of a first optical sensor according to the present invention.
Figure 2A:
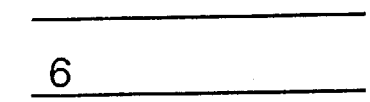
FIGS. 2A to 2G show a first embodiment of a method of manufacturing the first optical sensor according to the present invention.
Figure 2B:
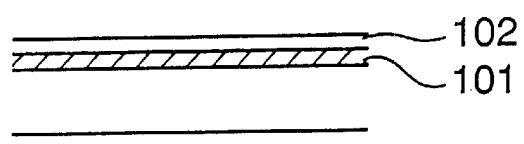
Figure 2C:
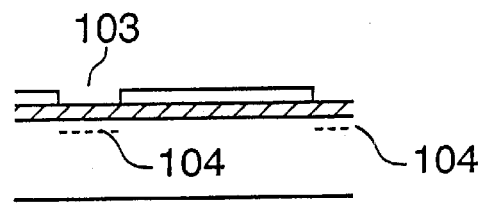
Figure 2D:
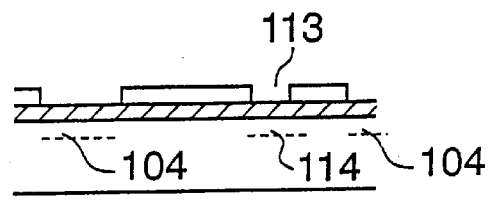
Figure 2E:
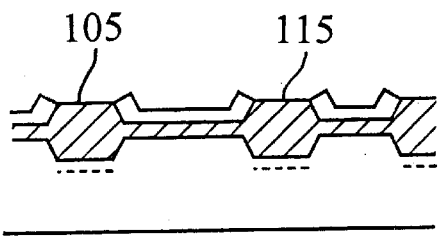
Figure 2F:
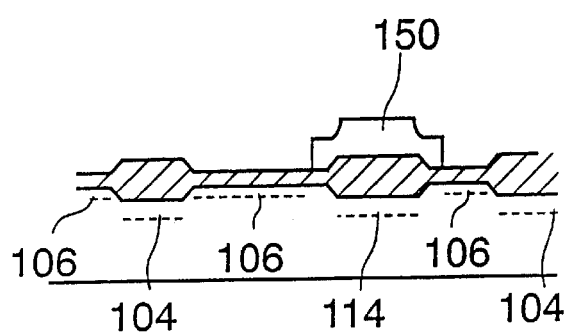
Figure 2G:
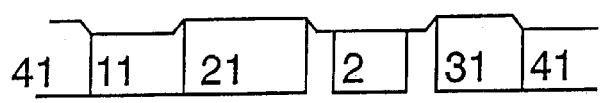
Figure 3A:
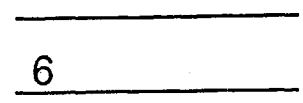
FIGS. 3A to 3H show a second embodiment of a method of manufacturing the first optical sensor according to the present invention.
Figure 3B:
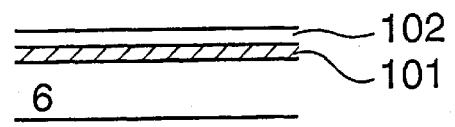
Figure 3C:
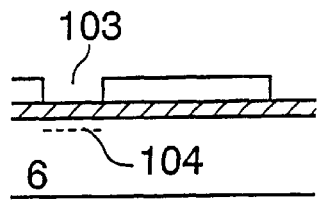
Figure 3D:
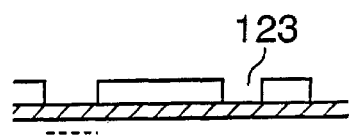
Figure 3E:
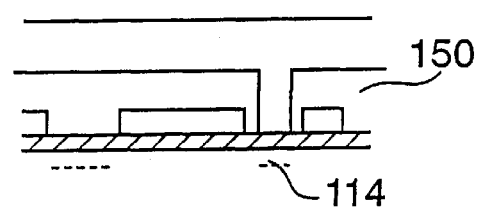
Figure 3F:
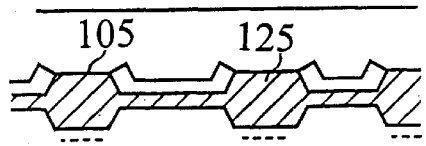
Figure 3G:
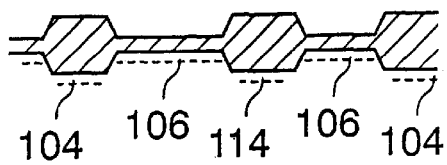
Figure 3H:
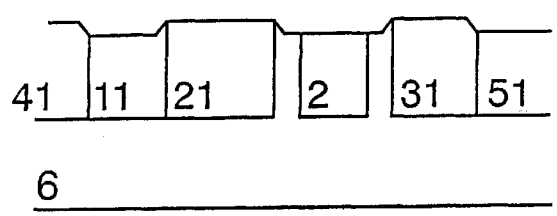
Figure 4A:
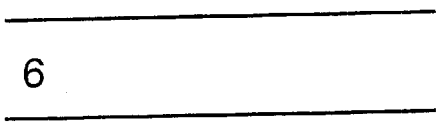
FIGS. 4A to 4G show a third embodiment of a method of manufacturing the first optical sensor according to the present invention.
Figure 4B:
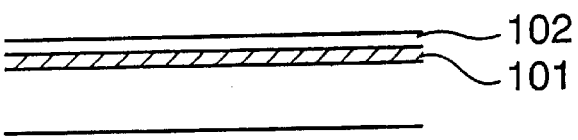
Figure 4C:
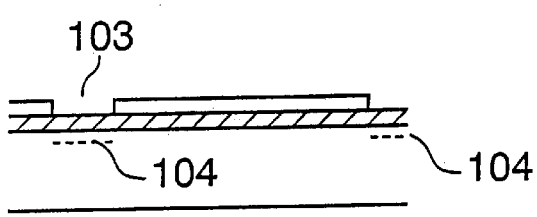
Figure 4D:
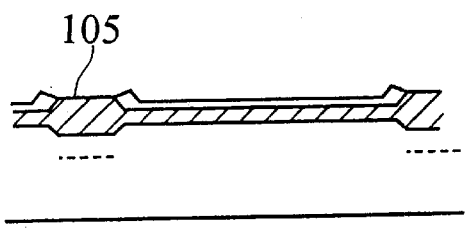
Figure 4E:
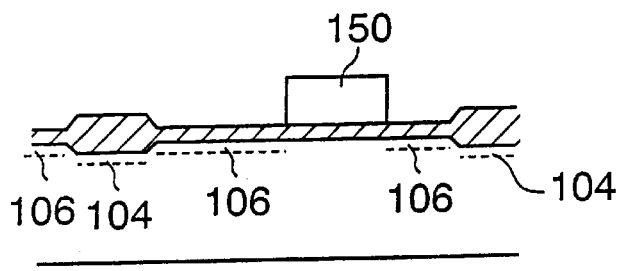
Figure 4F:
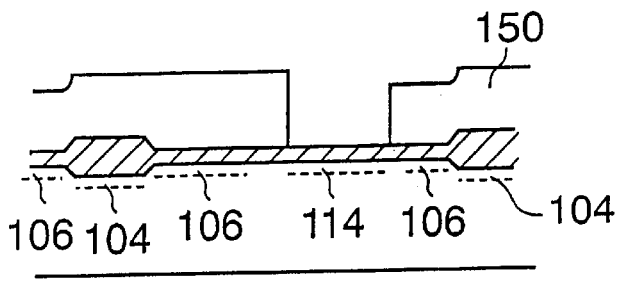
Figure 4G:
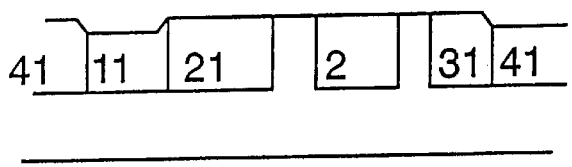

FIG. 1 is a cross sectional view of MOS transistors and a light-receiving section of an optical sensor according to an embodiment of the present invention. In this embodiment, P-channel MOS transistors 10 and 50, N-channel MOS transistors 20, 30, and 40, and a PN junction diode 1 that is a light-receiving element are formed on a P-type (100) silicon substrate 6. The P-channel MOS transistor 10 includes a gate 12 made of polysilicon and P+ regions 13 that are source and drain regions and are formed in an N-type well region 11. Similarly, the P-channel MOS transistor 50 includes a gate 52 made of polysilicon and P+ regions 53 that are source and drain regions and are formed in an N-type well region 51. Also, the N-channel MOS transistor 20 includes a gate 22 made of polysilicon and N+ regions 23 that are source and drain regions and are formed in a P-type well region 21. Similarly, the N-channel MOS transistor 30 includes a gate 32 made of polysilicon and N+ regions 33 that are source and drain regions and are formed in a P-type well region 31. Also, the N-channel MOS transistor 40 includes a gate 42 made of polysilicon and N+ regions 43 that are source and drain regions and are formed in a P-type well region 41. Each transistor is isolated from its adjacent transistors by thick field oxide films 68. In the N-type well regions 11 and 51 under the field oxide films 68, N+/− regions 14 and 54 whose impurity densities are higher than those in the well regions are formed. Also, in the P-type well regions 21, 31, and 41 under the field oxide films 68, P+/− regions 24, 25, 34, 35, and 44 whose impurity densities are higher than those in the well regions are formed.

The N-type well regions 11 and 51 have polarities which are different from the polarity of the silicon substrate, and contact the P-type well regions 21, 31, and 41. The diode 1 is a light-receiving element and is comprised of an N-type region 2 and the P-type silicon substrate 6. An N+ region 3 is formed in the N-type region 2 for establishing contact. Field oxide films 8 are formed on the N-type region 2 and light to be received passes through the field oxide films 8 and reaches the diode 1. Regions 9 having a width of 9 microns in which no impurities have been implanted, are provided between the N-type region 2 and the P-type well regions 21 and 31. The existence of the regions 9 in which no impurities have been implanted makes it possible to decrease the impurity density of the N-type region 2 of the diode 1 that is the light-receiving element, to decrease the impurity density of the PN junction of the P-type silicon substrate 6, and to allow a depletion layer formed at the PN junction to widely spread. As a result, it becomes possible to reduce the capacity of the PN junction portion of the diode 1. Also, the N-type well regions 11 and 51 contact the P-type well regions 21, 41, and 31, so that the withstand voltage, capacity, and leak current between the N-type well and the P-type well become the same as the characteristics of the N-type well and P-type well formed according to an ordinary CMOS process with which the light-receiving element diode 1 is not formed.

The present embodiment relates to a case where an optical sensor is produced on a P-type silicon substrate, although the same effect as above is obtained even if an optical sensor is formed on an N-type silicon. An embodiment where an optical sensor is formed on an N-type silicon substrate is described below. In FIG. 1, N-channel MOS transistors 10 and 50, P-channel MOS transistors 20, 30, and 40, and a PN junction diode 1 that is a light-receiving element are formed on an N-type (100) silicon substrate 6. The N-channel MOS transistor 10 includes a gate 12 made of polysilicon and N+ regions 13 that are source and drain regions and are formed in a P-type well region 11. Similarly, the N-channel MOS transistor 50 includes a gate 52 made of polysilicon and N+ regions 53 that are source and drain regions and are formed in a P-type well region 51. Also, the P-channel MOS transistor 20 includes a gate 22 made of polysilicon and P+ regions 23 that are source and drain regions and are formed in an N-type well region 21. Similarly, the P-channel MOS transistor 30 includes a gate 32 made of polysilicon and P+ regions 33 that are source and drain regions and are formed in an N-type well region 31. Also, the P-channel MOS transistor 40 includes a gate 42 made of polysilicon and P+ regions 43 that are source and drain regions and are formed in an N-type well region 41. Each transistor is isolated from its adjacent transistors by thick field oxide films 68. In the P-type well regions 11 and 51 under the field oxide films 68, P+/− regions 14 and 54 whose impurity densities are higher than those in the well regions are formed. Also, in the N-type well regions 21, 31, and 41 under the field oxide films 68, N+/− regions 24, 25, 34, 35, and 44 whose impurity densities are higher than those in the well regions are formed. The P-type well regions 11, and 51 have polarities, which are different from the polarity of the silicon substrate, and contact the N-type well regions 21, 31, and 41. The diode 1 that is a light-receiving element is constituted by a P-type region 2 and the N-type silicon substrate 6. A P+ region 3 is formed in the P-type region 2 for establishing contact. Field oxide films 8 are formed on the P-type region 2 and light to be received passes through the field oxide films 8 and reaches the diode 1. Regions 9 in which no impurities have been implanted are provided between the P-type region 2 and the N-type well regions 21 and 31.

The existence of the regions 9 in which no impurities have been implanted makes it possible to decrease the impurity density of the P-type region 2 of the diode 1 that is the light-receiving element, to decrease the impurity density of the PN junction of the N-type silicon substrate 6, and to allow a depletion layer formed at the PN junction to widely spread. As a result, it becomes possible to reduce the capacity of the PN junction portion of the diode 1. Also, the P-type well regions 11 and 51 contact the N-type well regions 21, 41, and 31, so that the withstand voltage, capacity, and leak current between the N-type well and the P-type well become the same as the characteristics of the N-type well and P-type well formed according to an ordinary CMOS process with which the light-receiving element diode 1 is not formed.

Figure 7:
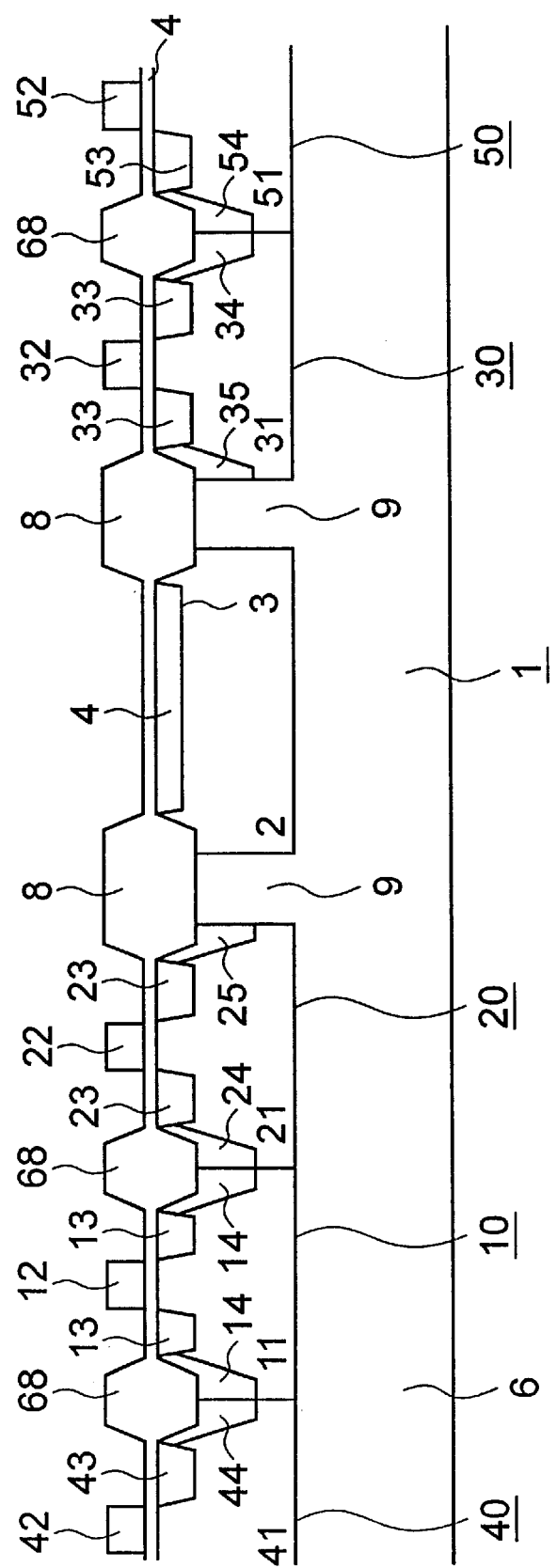
FIG. 7 is a cross sectional view of a second optical sensor according to the present invention.

FIG. 7 is a sectional view of another embodiment of the present invention. P-channel MOS transistors 10 and 50, N-channel MOS transistors 20, 30, and 40, and a PN junction diode 1 that is a light-receiving element are formed on a P-type (100) silicon substrate 6. The P-channel MOS transistor 10 includes a gate 12 made of polysilicon and P+ regions 13 that are source and drain regions and are formed in an N-type well region 11. Similarly, the P-channel MOS transistor 50 includes a gate 52 made of polysilicon and P+ regions 53 that are source and drain regions and are formed in an N-type well region 51. Also, the N-channel MOS transistor 20 includes a gate 22 made of polysilicon and N+ regions 23 that are source and drain regions and are formed in a P-type well region 21. Similarly, the N-channel MOS transistor 30 includes a gate 32 made of polysilicon and N+ regions 33 that are source and drain regions and are formed in a P-type well region 31. Also, the N-channel MOS transistor 40 includes a gate 42 made of polysilicon and N+ regions 43 that are source and drain regions and are formed in a P-type well region 41. Each transistor is isolated from its adjacent transistors by thick field oxide films 68. In the N-type well regions 11 and 51 under the field oxide films 68, N+/− regions 14 and 54 whose impurity densities are higher than those in the well regions are formed. Also, in the P-type well regions 21, 31, and 41 under the field oxide films 68, P+/− regions 24, 25, 34, 35, and 44 whose impurity densities are higher than those in the well regions are formed.

The N-type well regions 11 and 51 have polarities which are different from the polarity of the silicon substrate, and contact the P-type well regions 21, 31, and 41. The diode 1 is a light-receiving element and is comprised of an N-type region 2 and the P-type silicon substrate 6. An N+ region 3 is formed in the surface of N-type regions 2. Gate oxide film 4 is formed on the N+ region 3 and light to be received passes through the gate oxide film 4 and and reaches the diode 1. Regions 9 having a width of 9 microns, in which no impurities have been implanted, are provided between the N-type region 2 and the P-type well regions 21 and 31. In the embodiments described with reference to FIG. 1, the thick field oxide films 8 are formed above the diode 1 that is a light-receiving element. However, as shown in FIG. 7, thin gate oxide films may be formed above the diode 1 that is a light-receiving element. Even in this case, the effect of enhancing the sensitivity of a light-receiving element is obtained like in the embodiments shown in FIG. 1.

The first manufacturing method of the optical sensor shown in FIG. 1 or 7 is described below with reference to FIGS. 2A to 2G. These drawings show the steps for forming the N-type well regions 11 and 51, the P-type well regions 21, 31, and 41, and the N-type region 2 of the light-receiving element on the P-type silicon substrate 6. On the P-type silicon substrate 6, a silicon oxide film 101 having a thickness of 300 Å is formed through thermal oxidation and then a silicon nitride film 102 having a thickness of 500 Å is formed with a CVD method (see FIG. 2B). Portions 103 of the silicon nitride film above areas in which the N-type well regions 11 and 51 are to be formed are removed by etching, and phosphorus ions 104 whose volume is $1\times10^{13}/cm^2$ are implanted (see FIG. 2C). A portion 113 of the silicon nitride film above an area in which the N-type region 2 is to be formed is removed by etching, and phosphorus ions 114 whose volume is $2\times10^{12}/cm^2$ are implanted (see FIG. 2D). Then, selective oxide films 105 and 115 having a thickness of 1200 Å are formed in the portions 103 and 113 through thermal oxidation (see FIG. 2E). After the silicon nitride film 102 is completely removed, a surface above an area in which the N-type region 2 of the light-receiving element and the regions 9 around the N-type region 2 are to be formed is masked with a photoresist and boron ions 106 whose volume is $1\times10^{13}/cm^2$ are implanted (see FIG. 2F). During this process, the boron ions are not implanted into areas below the portions 103 and 113 because the thick oxide films 105 and 115 function as masks. Finally, drive-in processing is performed at 1175 degrees centigrade for six hours, thereby forming the N-type well regions 11 and 51, the P-type well regions 21, 31, and 41, and the N-type region 2 of the light-receiving element (see FIG. 2G). After these steps, a process that is the same as an ordinary CMOS process is performed to obtain the optical sensor shown in FIG. 1 or 7.

The second manufacturing method of the optical sensor shown in FIG. 1 or 7 is described below with reference to FIGS. 3A to 3H. These drawings show the steps for forming the N-type well regions 11 and 51, the P-type well regions 21, 31, and 41, and the N-type region 2 of the light-receiving element on the P-type silicon substrate 6. On the P-type silicon substrate 6, a silicon oxide film 101 having a thickness of 300 Å is formed through thermal oxidation and then a silicon nitride film 102 having a thickness of 500 Å is formed with a CVD method (see FIG. 3B). Portions 103 are formed, where the silicon nitride film above areas in which the N-type well regions 11 and 51 are to be formed is removed by etching, and phosphorus ions 104 whose volume is $1\times10^{13}/cm^2$ are implanted (see FIG. 3C). A portion 123 is formed, where the silicon nitride film above an area in which the N-type region 2 and the regions 9 around the N-type region 2 are to be formed is removed by etching (see FIG. 3D). The entire surface except for region 123 above an area in which the N type region 2 is to be formed is masked with a photoresist 150, and phosphorus ions 114 whose volume is $2\times10^{13}/cm^2$ are implanted (see FIG. 3E). Then, selective oxide films 105 and 125 having a thickness of 1200 Å are formed in the portions 103 and 123 through thermal oxidation (see FIG. 3F). After the silicon nitride film 102 is completely removed, boron ions 106 whose volume is $1\times10^{13}/cm^2$ are implanted into the entire of a wafer (see FIG. 3G). During this process, the boron ions are not implanted into areas below the portions 103 and 123 because the thick oxide films 105 and 125 function as masks. Finally, drive-in processing is performed at 1175 degrees centigrade for six hours, thereby forming the N-type well regions 11 and 51, the P-type well regions 21, 31, and 41, and the N-type region 2 of the light-receiving element (see FIG. 3H). After these steps, a process that is the same as an ordinary CMOS process is performed to obtain the optical sensor shown in FIG. 1 or 7.

The third manufacturing method of the optical sensor shown in FIG. 1 or 7 is described below with reference to FIGS. 4A to 4G. These drawings show the steps for forming the N-type well regions 11 and 51, the P-type well regions 21, 31, and 41, and the N-type region 2 of the light-receiving element on the P-type silicon substrate 6. On the P-type silicon substrate 6, a silicon oxide film 101 having a thickness of 300 Å is formed through thermal oxidation and then a silicon nitride film 102 having a thickness of 500 Å is formed with a CVD method (see FIG. 4B). Portions 103 of the silicon nitride film above areas in which the N-type well regions 11 and 51 are to be formed are removed by etching, and phosphorus ions 104 whose volume is $1\times10^{13}/cm^2$ are implanted (see FIG. 4C). Selective oxide films 105 having a thickness of 1200 Å are formed in the portions 103 through thermal oxidation (see FIG. 4D). After the silicon nitride film 102 is completely removed, a surface above an area in which the N-type region 2 of the light-receiving element and the regions 9 around the N-type region 2 are to be formed is masked with a photoresist, and boron ions 106 whose volume is $1\times10^{13}/cm^2$ are implanted (see FIG. 4E).

During this process, the boron ions are not implanted into areas below the portions 103 because the thick oxide films 105 function as masks. The entire surface except for a surface 113 above an area in which the N-type region 2 is to be formed is masked with a photoresist and phosphorus ions 114 whose volume is $2\times10^{12}/cm^2$ are implanted (see FIG. 4F). Finally, drive-in processing is performed at 1175 degrees centigrade for six hours, thereby forming the N-type well regions 11 and 51, the P-type well regions 21, 31, and 41, and the N-type region 2 of the light-receiving element (see FIG. 4G). After these steps, a process that is the same as an ordinary CMOS process is performed to obtain the optical sensor shown in FIG. 1 or 7.

Figure 5:
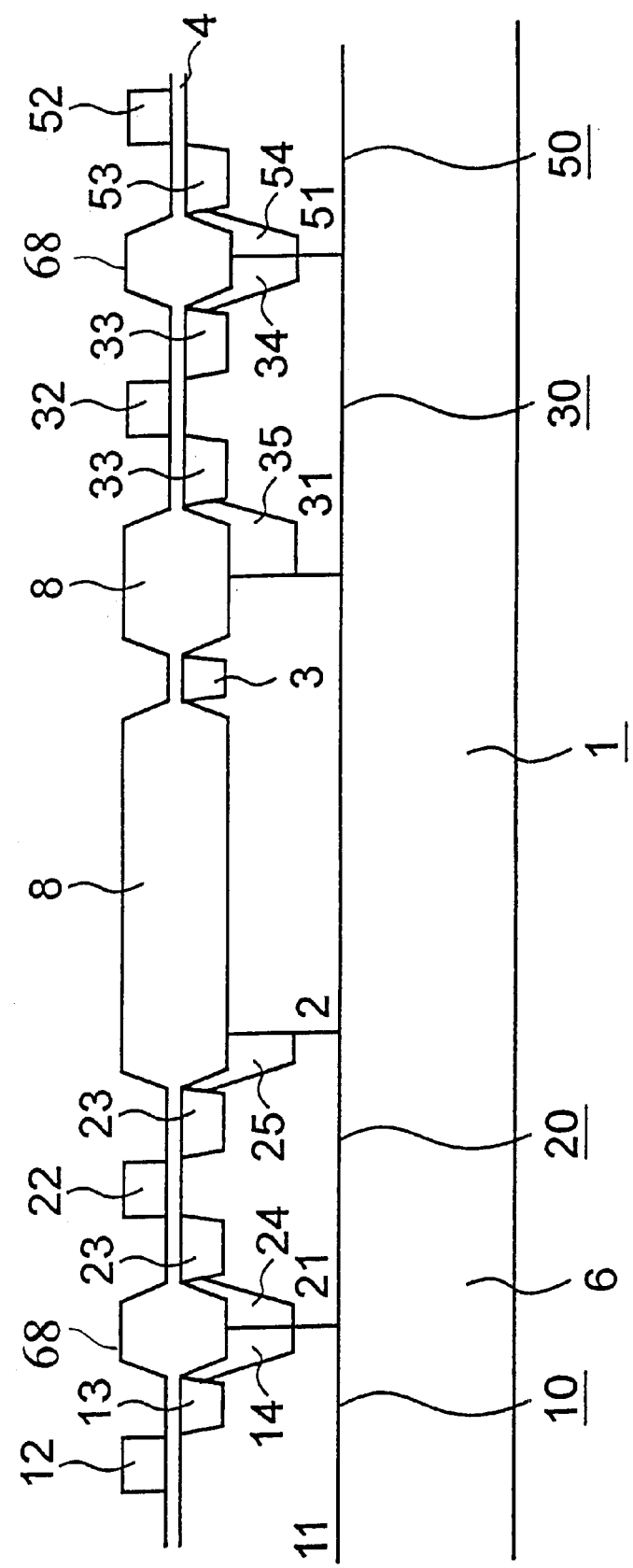
FIG. 5 is a cross sectional view of a conventional optical sensor.
Figure 6:
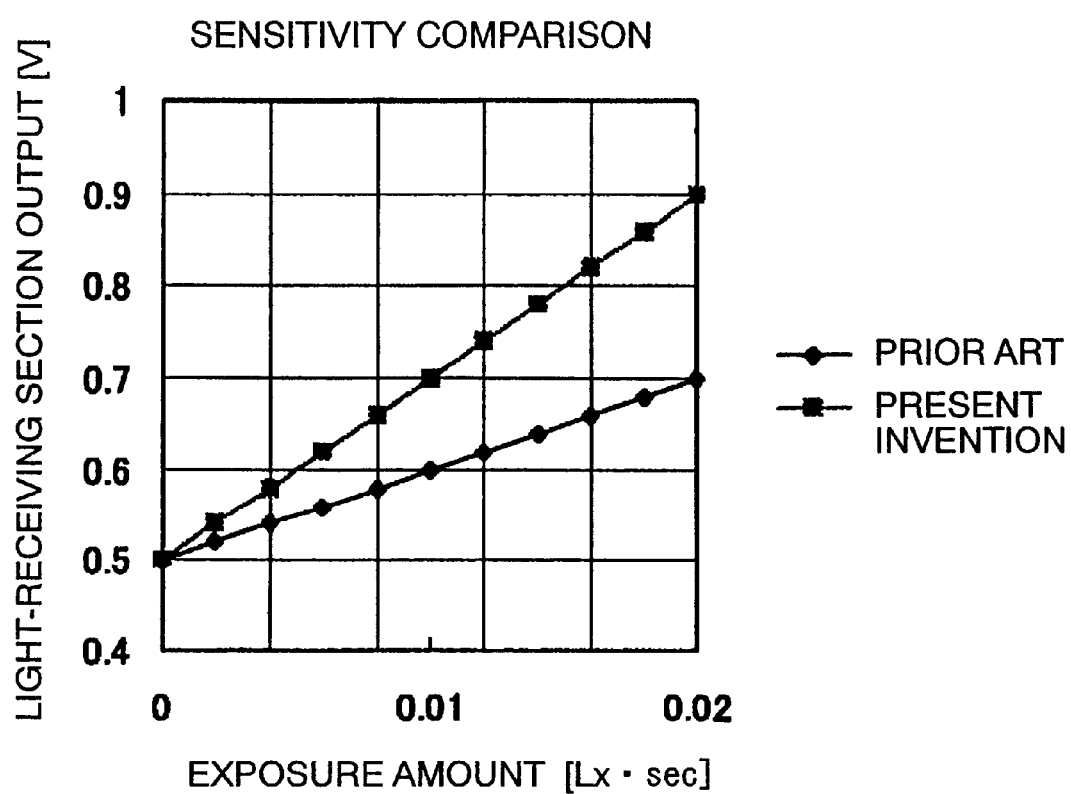
FIG. 6 shows sensitivity characteristics of light-receiving sections of the optical sensor according to the present invention and the conventional optical sensor.

FIG. 6 shows the sensitivities of the light-receiving sections of the optical sensor according to the present invention shown in FIG. 1 and a conventional optical sensor shown in FIG. 5. As shown in FIG. 6, the capacity of the PN junction portion of the diode that is the light-receiving section is reduced to around ½ of that in the case of the conventional optical sensor. This means that the sensitivity of the light-receiving section of the optical sensor according to the present invention is twice as high as that in the case of the conventional optical sensor.

With the technique of the present invention, it becomes possible to manufacture an optical sensor without changing characteristics of MOS transistors constituting ICs and LSIs and to provide an optical sensor having a light-receiving element with a high sensitivity. This makes it possible to provide an optical sensor that is produced at a low cost, operates with a low voltage power supply, consumes less electricity, includes an integrated high-performance processing circuit, and has a high sensitivity.

What is claimed is:

1. A method of manufacturing an integrated optical sensor having a P-type silicon substrate in which P-channel MOS transistors are formed in N-type well regions and N-channel MOS transistors are formed in P-type well regions, adjacent well regions being in contact with each other; and a semiconductor light-receiving element having an N-type region formed in the P-type silicon substrate to form a PN junction spaced apart from the N-type and P-type well regions, comprising the steps of:

implanting N-type impurities into the silicon substrate to simultaneously form the N-type well regions and the N-type region of the semiconductor light-receiving element;

selectively oxidizing the silicon substrate directly above the N-type well regions and the N-type region of the semiconductor light-receiving element;

forming a photoresist mask on and around the selectively formed oxide above the N-type region of the semiconductor light-receiving element; and implanting P-type impurities into the silicon substrate to form the P-type well regions using the photoresist mask and the selectively formed oxide as masks.

* * * * *